(12) United States Patent
Santos Rodriguez et al.

(10) Patent No.: US 11,081,382 B2
(45) Date of Patent: Aug. 3, 2021

(54) METHOD FOR PROCESSING A SUBSTRATE ASSEMBLY AND WAFER COMPOSITE STRUCTURE

(71) Applicant: Infineon Technologies AG, Neubiberg (DE)

(72) Inventors: Francisco Javier Santos Rodriguez, Villach (AT); Peter Irsigler, Obernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/904,076

(22) Filed: Jun. 17, 2020

(65) Prior Publication Data

US 2020/0402832 A1 Dec. 24, 2020

(30) Foreign Application Priority Data

Jun. 18, 2019 (DE) .......................... 102019004261.1

(51) Int. Cl.
*H01L 21/683* (2006.01)
(52) U.S. Cl.
CPC .............. *H01L 21/6835* (2013.01)
(58) Field of Classification Search
CPC ....... H01L 21/6835; H01L 2924/00014; H01L 2924/00; H01L 2924/00012; H01L 2224/94; H01L 2224/131; H01L 2924/0002; H01L 2221/68327; H01L 24/19; H01L 25/50

USPC ........................................................ 438/17
See application file for complete search history.

(56) References Cited

U.S. PATENT DOCUMENTS 8,841,204 B2 * 9/2014 Wang ...................... H01L 24/32
 438/458
9,200,883 B2 * 12/2015 Andry ...................... G01B 5/28

FOREIGN PATENT DOCUMENTS

| DE | 10301245 A1 | 7/2004 |
| DE | 102004018250 A1 | 11/2005 |
| DE | 102014207012 A1 | 10/2014 |

\* cited by examiner

*Primary Examiner* — Vu A Vu
(74) *Attorney, Agent, or Firm* — Murphy, Bilak & Homiller, PLLC

(57) ABSTRACT

A method for processing a substrate assembly with a semiconductor device layer includes: arranging an auxiliary carrier at the substrate assembly such that a connection surface of the auxiliary carrier and a first surface of the substrate assembly directly adjoin each other; fixedly attaching the auxiliary carrier to the substrate assembly by melting a carrier portion of the auxiliary carrier and a substrate portion of the substrate assembly that directly adjoins the carrier portion such that the auxiliary carrier and the substrate assembly locally fuse only in fused portions of the auxiliary carrier and the substrate assembly, wherein the fused portions are laterally separated from each other by at least one unfused portion; and processing the semiconductor device layer of the substrate assembly with the auxiliary carrier fixedly attached to the substrate assembly.

26 Claims, 7 Drawing Sheets

METHOD FOR PROCESSING A SUBSTRATE ASSEMBLY AND WAFER COMPOSITE STRUCTURE

TECHNICAL FIELD

The present disclosure generally relates to semiconductor substrate assembly processing and to wafer composite structures.

BACKGROUND

Thin semiconductor substrate assemblies comprising thin semiconductor wafers may be mechanically fragile due to their low thickness. Therefore, there may be a risk of damage and even breakage of the substrate assembly during processing. Damage may be prevented or at least reduced by use of mechanically stabilizing support carrier systems. However, currently available support carrier systems typically do not simultaneously allow for applying high-temperature processes to the substrate assembly and for nondestructively removing the support carrier system after processing.

SUMMARY

Some embodiments relate to a method for processing a substrate assembly with a semiconductor device layer. The method may comprise the step of arranging an auxiliary carrier at the substrate assembly such that a connection surface of the auxiliary carrier and a first surface of the substrate assembly directly adjoin each other at least in places. The method may further comprise the step of fixedly attaching the auxiliary carrier to the substrate assembly by melting a carrier portion of the auxiliary carrier and a substrate portion of the substrate assembly that directly adjoins the carrier portion of the auxiliary carrier such that the auxiliary carrier and the substrate assembly locally fuse only in fused portions of the auxiliary carrier and the substrate assembly. In a further process step, the semiconductor device layer of the substrate assembly may be processed, with the auxiliary carrier being fixedly attached to the substrate assembly during processing. The fused portions may cover at most 20% of the first surface of the substrate assembly.

Further embodiments relate to a wafer composite structure comprising an auxiliary carrier with a connection surface and a substrate assembly with a semiconductor device layer and a first surface. The auxiliary carrier and the substrate assembly may be locally fused only in fused portions of the auxiliary carrier and substrate assembly. The fused portions may cover at most 20% of the first surface of the substrate assembly.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated examples can be combined unless they exclude each other. Examples are depicted in the drawings and are detailed in the description which follows.

DETAILED DESCRIPTION

Figure 1A:
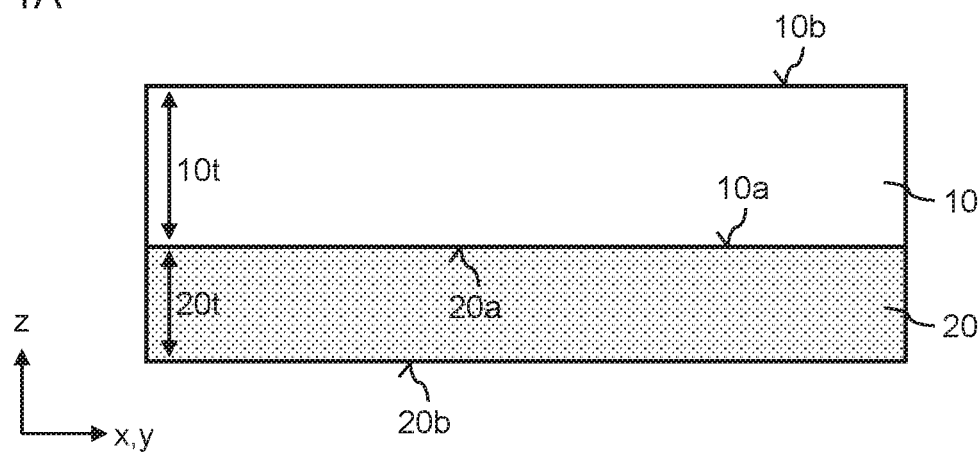
FIGS. 1A through 1E illustrate exemplary embodiments of a method for processing a substrate assembly and of a wafer composite structure.

Hereinafter, methods for processing a substrate assembly are provided. The substrate assembly may comprise a semiconductor device layer and, optionally, further layers and/or components (for example, but not being limited to: a contact structure, a metallization structure, a passivation structure, an insulation layer, a support structure). The substrate assembly may mainly extend along lateral directions; a diameter of the substrate assembly along at least one lateral direction may correspond to at least 95% and at most 110% of a production standard for semiconductor wafers (e.g., 4 inch (100 mm), 6 inch (150 mm), 8 inch (200 mm), 12 inch (300 mm) or the like). Along the lateral directions (i.e., in a top view onto the substrate assembly from a vertical direction), the substrate assembly may have an elliptical (e.g., circular) or a polygonal (e.g., hexagonal or rectangular or even quadratic) shape. Perpendicular to the lateral directions, in the vertical direction, the substrate assembly may have a thickness that is small compared to the diameter (e.g., at most 1% or at most 0.5% of the diameter). For example, the thickness of the substrate assembly may be at most 1 mm (or at most 700 µm or at most 500 µm). A first surface and a second surface of the substrate assembly may run essentially (i.e., except for e.g. surface roughness and/or slight thickness variations along the substrate assembly) along the lateral directions.

The semiconductor device layer may be or may comprise at least part of a semiconductor wafer and/or at least one epitaxial semiconductor layer. The epitaxial semiconductor layer may have been epitaxially grown on the semiconductor wafer and/or on or above a support structure of the substrate assembly. Unless explicitly stated otherwise, the method is not limited to any specific semiconductor material or combination of materials for the semiconductor device layer. Possible semiconductor materials for the semiconductor device layer include, but are not limited to: Si, GaN, InGaN, SiC, $Ga_2O_3$, GaAs, C, InP, MoS, graphene. Besides at least one semiconductor material, the semiconductor device layer may comprise further materials (e.g. polycrystalline portions and/or metal portions) and/or components (e.g., doping atoms and/or impurities caused by manufacturing).

The semiconductor device layer may comprise at least functional layers (e.g., at least one semiconductor device structure) of at least one semiconductor device. In principle, any semiconductor device that is typically processed on wafer level may be considered. Unless explicitly stated otherwise, the method is not limited to any specific semiconductor device. Exemplary semiconductor devices include, without being limited to: a semiconductor switching device (e.g., IGFET, such as MOSFET, JFET, FINFET; thyristor; diode and/or IGBT), an optoelectronic semiconductor device (e.g., LED; photodiode; photovoltaic cell and/or laser diode), a micro-electromechanical or a micro-opto-electromechanical device-system (MEMS or MOEMS, respectively; e.g., a sensor, a mirror array and/or an optical array). Typically, the semiconductor device is a switching semiconductor device. The semiconductor device layer may be pre-processed. As a mere example, due to the pre-processing, the semiconductor device layer may comprise at least one of: a doped region, a trench, a separation region, a structured region, a buried region, a void/cavity. The first surface may correspond to a surface (e.g., the so-called front side surface or the backside surface) of the semiconductor device layer, in particular to a surface of the semiconductor device structures comprised by the semiconductor device layer. Pre-processing the substrate assembly may result in a final first surface that may not require further processing steps to be applied to the first surface.

An auxiliary carrier may be provided. The auxiliary carrier may be integrally formed (i.e., may comprise of a single piece) or may comprise multiple parts. In either case the auxiliary carrier may comprise openings or may be free of openings. In the case of multiple parts, at least some of the parts may be connected with each other. In some examples, a diameter of the auxiliary carrier may be at least 80% and/or at most 120% (or at least 90% and at most 110%) of the diameter of the substrate assembly. An outer circumference of the auxiliary carrier may have the same shape as the substrate assembly (e.g., if the substrate assembly is elliptical or polygonal, the outer circumference of the auxiliary carrier may also be elliptical or polygonal, respectively). A thickness of the auxiliary carrier may be at least 50 µm (e.g., at least 150 µm) and/or at most 1.5 mm (e.g., at most 1.2 mm). The auxiliary carrier may comprise at least one of the following materials or may consist of one of the following materials: an amorphous glass, a crystalline glass-like material (e.g., fused silica). For example, the material of the auxiliary carrier may be chosen such that the coefficient of thermal expansion (CTE) of the auxiliary carrier is approximately the CTE of the substrate assembly (e.g., within a tolerance of ±10% of the CTE of the substrate assembly). Here and in the following, the CTE of a component (e.g., the auxiliary carrier or the substrate assembly or a stress-inducing layer) typically refers to the mean CTE of said component averaged over the entire component (particularly in the case of a composition of several materials). In addition or as an alternative, the material of the auxiliary carrier may be chosen such that: (i) the auxiliary carrier may be high-temperature stable, i.e., the auxiliary carrier may withstand temperatures of above 350° C. (or above 400° C., or above 450° C., or even above 500° C.) and below 700° (or below 650° C. or below 600° C.) and/or (ii) a surface portion of the auxiliary may be easily meltable, in particular with a laser beam.

In at least one example, the method may comprise arranging the auxiliary carrier at the substrate assembly such that a connection surface of the auxiliary carrier and the first surface of the substrate assembly directly adjoin each other at least in places. For example, the first surface and the connection surface may directly adjoin each other at least in connection regions of the first surface and the connection surface.

The method may further comprise fixedly attaching the auxiliary carrier to the substrate assembly. Throughout this application if a first component (e.g., the auxiliary carrier) is "fixedly attached" to a second component (e.g., the substrate assembly), the first component and the second component are firmly connected such that they two components can be lifted together by only lifting only one of the two components. The auxiliary carrier may be fixedly attached to the substrate assembly by melting a carrier portion of the auxiliary carrier and a substrate portion of the substrate assembly that directly adjoins (e.g., in the connection regions) the carrier portion of the auxiliary carrier. The melting may be performed such that the auxiliary carrier and the substrate assembly (in particular the carrier portion and the substrate portion) locally fuse only in fused portions of the auxiliary carrier and the substrate assembly. In particular, at the first surface, the fused portions may be laterally separated from another by at least one unfused portion where the auxiliary carrier and the substrate assembly are not fused.

In the fused portions, the auxiliary carrier (i.e., a material of the auxiliary carrier) and the substrate assembly (i.e., a material of the substrate assembly) are fused. That is to say, a carrier portion of the auxiliary carrier and a substrate portion of the substrate assembly may be merged in the fused portions and the materials of the two components may mesh and/or interlock. For example, at least part of the carrier portion may penetrate the substrate assembly and may be surrounded by the substrate portions. The fused portions may provide the only means for fixedly attaching the auxiliary carrier to the substrate assembly. Typically, only the substrate portion and the carrier portion that are to be fused are melted. Alternatively, a further substrate portion and a further carrier portion may be melted, but do not form fused portions (e.g., due to insufficient heating). However, typically, a majority of material of the substrate assembly at or near the first surface is not melted.

The first surface and the connection surface may be free of fused regions outside the fused portions. The fused portions may cover at most 20% (or at most 15% or at most 10% even at most 5%) of the first surface of the substrate assembly. That is to say, at least 80% (or at least 85% or at least 90%) of the first surface of the substrate assembly may be free of fused portions. Typically, at least 0.5% (or at least 2% or at least 5%) of the first surface is covered by the fused portions. In addition or as an alternative, at most 50% (or at most 30% or even at most 20%) and/or at least 2% (or at least 10% or at least 15%) the connection surface of a solid portion of the auxiliary carrier (i.e., non-opening comprising parts of the auxiliary carrier) may be covered by the fused portions. The fused portions may be evenly distributed along the connection surface (e.g., neighboring fused portions may differ in their distance by at most ±10%).

Having only a small portion of the first surface covered by the fused portions allows for fixedly attaching an auxiliary carrier to the substrate assembly by melting parts of the auxiliary carrier and of the substrate assembly, with still being able to release the connection between the auxiliary carrier and the substrate assembly. The size of the individual fused portions and the geometrical distribution of the fused portions along the first surface and/or along the connection surface may be chosen appropriately in order to decrease the size of the fused portions overall (in particular, decrease the size of the coverage of the first surface with fused portions) and to still allow for sufficient mechanical stability. This may allow for fixedly attaching a high-temperature-stable auxiliary carrier to the substrate assembly via a high-temperature stable connection and removing the auxiliary carrier at a later process step without damaging or destroying the semiconductor device layer of the substrate assembly.

According to some examples, the method may comprise processing the semiconductor device layer of the substrate assembly with the auxiliary carrier fixedly attached to the substrate assembly. During processing, the auxiliary carrier may mechanically stabilize the substrate assembly and/or may protect the substrate assembly from mechanical damage during processing.

According to some examples, the method further comprises the step of detaching the auxiliary carrier from the substrate assembly. The auxiliary carrier thus may be a reversible carrier that is detached from the substrate assembly after processing. For example, the auxiliary carrier may be detached from the substrate assembly by re-melting the fused portions of the auxiliary carrier and the substrate assembly such that the fused portions are released. During re-melting, an additional force (e.g., lifting and/or gravitational force) may be applied to the auxiliary carrier and/or the substrate assembly, such that the auxiliary carrier and the substrate assembly experience a traction.

According to at least one example, detaching the auxiliary carrier from the substrate assembly may comprise changing the temperature of the auxiliary carrier from a first carrier temperature to a second carrier temperature while changing the temperature of the substrate assembly from a first substrate temperature to a second substrate temperature. The first carrier (substrate) temperature may be smaller or larger than the second carrier (substrate) temperature. Typically, the first carrier (substrate) temperature is larger than the second carrier (substrate) temperature. The second substrate temperature may be different from the second carrier temperature (e.g., the second substrate temperature may be higher than the second carrier temperature if the second carrier temperature is lower than the first carrier temperature). In other words: the substrate assembly and the auxiliary carrier are subjected to a change in temperature that is different for the substrate assembly and the auxiliary carrier. The first substrate temperature and the first carrier temperature may be approximately equal (e.g., an initial temperature where the auxiliary carrier and the substrate assembly are in thermal equilibrium). The change in temperature (i.e., form the first substrate temperature to the second substrate temperature and from the first auxiliary temperature to the second auxiliary temperature) may be performed such that and the material of the substrate assembly and the material of the auxiliary carrier may be chosen such that the auxiliary carrier and the substrate assembly experience a different thermal expansion during the change in temperature. Due to the difference in thermal expansion, stresses may be generated at the fused portions between the auxiliary carrier and the substrate assembly, which stresses may lead to mechanical stress being induced in at least some of the fused portions. The induced stress may lead to cracking of the fused portions and thus to a damage of the fused portions. This will eventually result in breaking of the connection between the auxiliary carrier and the substrate assembly. The difference in temperature change of the auxiliary carrier and the substrate assembly is typically chosen such that a potential difference in thermal expansion due to a CTE mismatch between the auxiliary carrier and the substrate assembly is enhanced. For example, both the auxiliary carrier and the substrate assembly may initially be at a first temperature, e.g. at ambient temperature. Then, the auxiliary carrier or the substrate assembly may be treated with a cooling means such that only the temperature of the auxiliary carrier or the substrate assembly, respectively, is changed (e.g., cooled) to a second temperature (i.e., the second carrier temperature or the second substrate temperature, respectively). Typically, the auxiliary carrier is treated with the cooling means to avoid damage of the semiconductor device layer. Heat conduction between the auxiliary carrier and the substrate assembly may lead to a slight temperature change also of the substrate assembly or the auxiliary carrier, respectively (i.e., the "non-cooled component" is cooled to the second substrate temperature or the second carrier temperature, respectively). For example, a cooling means (e.g., liquid nitrogen) may be applied to (e.g., brought into direct contact with, e.g. sprayed and/or poured onto) the second surface of the substrate assembly that faces away from the auxiliary carrier or the back surface of the auxiliary carrier that faces away from the substrate assembly.

In an additional or alternative example, detaching the auxiliary carrier from the substrate assembly may comprise attaching (e.g., fixedly and/or removably attaching) a stress-inducing layer to the auxiliary carrier and/or to the substrate assembly at a first temperature. In some examples, the stress-inducing layer may cover at least 80% (or at least 90% or at least 95%) of a back surface of the auxiliary carrier opposite the connection surface and/or of a second surface of the substrate assembly opposite the first surface. The stress-inducing layer may comprise a polymer (e.g., comprising PDMS) and, optionally, an adhesion layer for attaching the stress-inducing layer to the auxiliary carrier and/or the substrate assembly. The material of the stress-inducing layer may be chosen such that a CTE of the stress-inducing layer differs from a CTE of the auxiliary carrier and the substrate assembly. After attaching the stress-inducing layer to the substrate assembly, at least the stress-inducing layer may be cooled to a second temperature below the first temperature while the stress-induced layer is attached to the auxiliary carrier or to the substrate assembly. The second temperature and the difference in CTE of the stress-inducing layer and the CTE of the auxiliary carrier and the substrate assembly (CTE difference) may be chosen such that mechanical stress is induced in at least some of the fused portions. In particular, during cooling, mechanical stresses may be induced to at least some (typically a majority or all) of the fused portions due the CTE difference of the stress-inducing layer and the auxiliary carrier or the stress-inducing layer and the substrate assembly. The induced stress may lead to cracking of the fused portions and thus to a damage of the fused portions. Since the fused portions are typically small compared to the entire lateral extend of the stress-inducing layer on the auxiliary carrier or on the substrate assembly, the stress induced in the fused portion may be comparatively large, thus focusing the cracks in the fused portions. Outside the fused portion, comparatively little stress may be induced. This will eventually result in breaking of the connection between the auxiliary carrier and the substrate assembly. After cooling and an optional re-heating step, the auxiliary carrier may be removed from the substrate assembly. For example, the first temperature and/or second temperature may be an ambient temperature and having the stress-inducing layer "at" or cooling it "to" the first or second temperature may correspond to placing the stress-inducing layer (and the components attached to it) in said ambient temperature. In the case of the stress-inducing layer comprising a polymer, the first temperature may be above a glass transition temperature of the polymer and the second temperature may be at most 40° C. above or even below the glass transition temperature of the polymer.

In yet another additional or alternative example, the semiconductor device layer of the substrate assembly may comprise a plurality of semiconductor device structures and a plurality of separation regions (sometimes also called "kerf regions" or "dicing regions", wherein neighboring semiconductor device structures are laterally separated from one another by at least one of the separation regions. The separation regions may be connected with one another or at least some or even all of the separation regions may be separated from each other. The fused portions may be located only above the separation regions in a vertical direction. That is to say, the fused portions may not be located in a region above the semiconductor device structures. For example, in a vertical direction, the fused portions and the separation regions overlap and/or the fused portions may be entirely covered by the separation regions. A width of the separation regions may be larger than a diameter of the fused portions. The method further comprises separating the semiconductor device structures and detaching the auxiliary carrier from the substrate assembly in one combined step. This may be realized by dicing, along the vertical direction, through the separation regions and through respective fused portions above the separation regions. During dicing, the fused portions may be damaged or even destroyed, thus resulting in release of the connection between the (remaining) auxiliary carrier and the substrate assembly. In particular, singulated semiconductor device structures may result from the dicing process, which are free of any part of the auxiliary carrier.

According to some examples, the substrate assembly comprises a mechanically weak structure. In a vertical direction, the fused portions and the mechanically weak structure overlap. The fused portions may be located only above the mechanically weak structure in a vertical direction. For example, in a vertical direction, the fused portions may be entirely covered by the mechanically weak structure. Detaching the auxiliary carrier may comprise selectively removing the mechanically weak structure from the substrate assembly (e.g., with etching). The mechanically weak structure may comprise a semiconductor material (e.g., the semiconductor material of the semiconductor device layer) and cavities (e.g., pores, voids, holes and/or bubbles) that are at least partially enclosed by the semiconductor material and may be filled with gas (e.g., air) and/or a fluid, both at or below room pressure. For example, at least 10% (or at least 20% or at least 30% or even at least 50%) in volume of the mechanically weak structure may consist of the cavities, while the rest of the mechanically weak structure may be from the semiconductor material. The mechanically weak structure may be a continuous layer or may comprise several separated portions. For example, the mechanically weak structure may only be present in regions above the fused portions.

In some examples, the method may comprise attaching (e.g., fixedly attaching) a temporary carrier to the second surface of the substrate assembly before detaching the auxiliary carrier from the substrate assembly. The second surface of the substrate assembly may be opposite the first surface of the substrate assembly and may face away from the auxiliary carrier. The temporary carrier may be mechanically flexible (e.g., may be a foil or a tape) or may comprise a mechanically flexible carrier component (e.g., may comprise a foil or a tape). The temporary carrier may, in addition or as an alternative, comprise a dicing frame used during dicing the semiconductor device layer, e.g. into individual semiconductor device structures. The temporary carrier may provide mechanical stabilization of the substrate assembly and further processing steps after detaching the auxiliary carrier. After the further processing steps, the temporary carrier may be removed, in particular without damaging the substrate assembly. Attaching the temporary carrier to the second surface may, for example, comprise adhering and/or bonding the temporary carrier to the second surface.

According to some examples, the fused portions may be laterally separated from another at the first surface by at least one unfused portion where the auxiliary carrier and the substrate assembly are not fused. For example, at least portions of the auxiliary carrier and the substrate assembly may directly adjoin each other at the unfused portions and/or at least portions of the auxiliary carrier and the substrate assembly may be separated (e.g., by a further component and/or by ambient gas) at the unfused portions. The unfused portions may partially or even completely surround the fused portions. The auxiliary carrier may at least partially (e.g., completely) cover the substrate assembly at the unfused portions. At the unfused portions, semiconductor device structures of the semiconductor device layer may be located. For example, the semiconductor device structures of the semiconductor device layer may be free of fused portions.

In some examples, the auxiliary carrier comprises at least one opening. The auxiliary carrier may be fixedly attached to the substrate assembly such that, in a vertical direction, the at least one opening and at least one unfused portion at least partially overlap. That is to say, directly after attaching the auxiliary carrier to the substrate assembly, the unfused portion may be accessible (e.g., freely accessible) through the opening of the auxiliary carrier.

It may be possible that the auxiliary carrier comprises a ring part and at least one opening (e.g., exactly one opening), wherein the ring part encloses the at least one opening. The ring part may cover only an outer circumference of the substrate assembly. The fused portions may be located only in the region of the ring part. For example, the auxiliary carrier may be ring-shaped with a solid part of the auxiliary carrier enclosing (e.g., completely enclosing) the opening. In this context, "ring-shaped" means that the connection surface is a connected face, but not simply connected. However, the term "ring-shaped" does not limit the shape of the substrate assembly and/or the auxiliary carrier to a rounded shape (e.g., elliptical or even circular), but rather, polygonal rings may also be available.

In at least some examples, the auxiliary carrier comprises a plurality of bridges of a grid and a plurality of openings that are enclosed by the plurality of bridges. That is to say, the auxiliary carrier may be grid-shaped, with a solid part of the auxiliary carrier building the riches of the grid that enclose the openings. The fused portions may be located only in the region of the bridges of the grid. In particular, the fused portions may be located only at crossing regions where two bridges cross. In some examples, the openings of the grid may be positioned above semiconductor device structures of the semiconductor device layer, while the bridges of the grid may be positioned above separation regions between the semiconductor device structures.

According to some examples, the method comprises applying a filler material such that the filler material at least partially covers the at least one unfused portion and/or such that the filler material fills at least part of openings in the auxiliary carrier. The filler material is typically applied after fixedly attaching the auxiliary carrier to the substrate assembly. For example, the filler material is applied in openings of the auxiliary carrier. The filler material may, for instance, cover semiconductor device structures of the semiconductor device layer of the substrate assembly. The filler material may be a non-sticking material that may fill openings or holes or gaps between the auxiliary carrier and the substrate assembly. Typically, the filler material is free of a mechanically stabilizing property. For example, the filler material may be or may comprise a foam. It may also possible that the filler material comprises or is a fluid (e.g., water) and/or a gas, in particular a high-pressure gas (i.e., with a pressure above ambient pressure).

According to at least some examples, the auxiliary carrier mechanically stabilizes and/or mechanically protects the substrate assembly during processing the substrate assembly. Throughout this specification, if a first component "mechanically stabilizes" a second component, this may mean that the second component is mechanically reinforced by the first component such that the compound of the first and the second component may be mechanically handled (e.g., with tweezers) during processing. Further, if a first component "mechanically protects" a second current component, this may mean that the first component reduces or even prevents mechanical damages (e.g., cracks) in the second component during processing.

In some examples, after fixedly attaching the auxiliary carrier to the substrate assembly, the method may further comprise fixedly attaching a support cover to the auxiliary carrier at a back surface of the auxiliary carrier, which back surface is opposite the connection surface of the auxiliary carrier. The support cover may, for example, comprise an amorphous glass and/or a crystalline glass-like material. Fixedly attaching the support cover to the auxiliary carrier may comprise at least one of: (i) arranging the support cover at the auxiliary carrier such that a front surface of the support cover directly adjoins the back surface of the auxiliary carrier at least in places and, afterwards, melting a portion of the auxiliary carrier and a portion of the support cover such that the auxiliary carrier and the support cover locally fuse in further fused portions; (ii) soldering the support cover to the auxiliary carrier (e.g., glass soldering with a glass eutectic system). In some examples, the auxiliary carrier comprises at least one opening and the support cover overlaps the at least one opening of the auxiliary carrier at least in places and/or covers (e.g., entirely covers) the at least one opening of the auxiliary carrier.

According to some examples, melting and/or, if applicable (i.e., for those examples where re-melting occurs), re-melting the carrier portion and the substrate portion comprises welding and/or laser welding (e.g., laser-micro welding). In addition or as an alternative, melting and/or, if applicable, re-melting the carrier portion and the support cover may comprise welding and/or laser welding. Laser welding may comprise irradiating the substrate portion and the carrier portion that are to be melted or re-melted with a laser beam. The laser beam may be focused to the region where melting or re-melting should take place. This may allow for melting only a small portion of the auxiliary carrier and the substrate assembly.

A beam width (e.g., a FWHM) of the laser beam at the region where melting or re-melting should take place (e.g., at the substrate portion and/or the carrier portion) may be at most 1 mm (or at most 100 µm or at most 50 µm or even at most 10 µm). For example, a peak wavelength of the laser beam may be at least 400 nm and at least 1400 nm, for example at least 800 nm and/or at most 1200 nm or at least 350 nm and at most 700 nm. For example, the laser beam may be emitted in pulses having a pulse length of less than 1 µs (or less than 100 ns). Typically, the pulse length is less than 10 ns (or less than 1 ns, or less than 100 ps or less than 50 ps, less than 20 ps, or less than 10 ps). The pulse length may even be below 1 ps, i.e. in the femtosecond regime. A pulse energy and/or a repetition rate of the laser beam may be chosen appropriately depending on the pulse length. For example, the pulse energy may be at least 0.1 µJ/pulse for a pulse length of below 1 ps. The repetition rate may be in the khZ regime or even in the MHz regime. In other examples, however, the laser beam may be continuous wave (OW) or quasi-continuous wave, e.g. with a pulse length above 1 µs or above 10 µs. In some examples, the laser may be a fiber laser.

In some examples, the substrate portion that is melted comprises an absorption layer. The absorption layer may have a higher absorption coefficient than a semiconductor material of the semiconductor device layer, in particular at a wavelength of a laser beam used for laser welding (e.g., at a wavelength of at least 400 nm and at most 1400 nm). For example, the absorption layer may be deposited over the semiconductor device layer. In addition or as an alternative, the absorption layer may be part of the semiconductor device layer, but the material of the semiconductor device layer may be altered in the region of the absorption layer (e.g., via implantation, chemical deposition and/or etching). The absorption layer may be present only in an outer region of the substrate assembly. A geometry of at least part of the absorption layer may correspond to a geometry of the support structure, for example. In some examples, the support structure may be ring-shaped or grid-shaped. In this case, at least a part of the absorption layer may also be ring-shaped or grid-shaped, respectively. It may be possible that the absorption layer is only present in regions where the auxiliary carrier covers the substrate assembly. The absorption layer may be particularly useful in the case of a transparent semiconductor device layer (i.e., transparent at a wavelength of the laser beam used for laser welding). Hereinafter, a component is "transparent" ("nontransparent") for light of a specific wavelength if the component has an absorption coefficient of at most 50% (for nontransparent: at least 70% or at least 80% or at least 90%) for light of said specific wavelength. In some examples, the absorption layer may comprise at least one of: (i) a metal (e.g., a silicide); (ii) amorphous material (e.g., amorphous silicon); (iii) a semiconductor material of the substrate assembly with implanted ions; (iv) silicon (e.g., polycrystalline silicon). For example, for (i), a metallization layer (e.g., comprising a silicide, such as NiAlSi, NiSi) may be formed over the semiconductor device layer, wherein parts of the metallization layer may form a contact metallization of the semiconductor device structures of the semiconductor device layer and a further part of the metallization may be comprised by the fused portions.

The auxiliary carrier may be fixedly attached to the first surface of the substrate assembly, while it may be possible to process at least the second surface of the substrate assembly that is opposite the first surface while the auxiliary carrier is fixedly attached to the substrate assembly. Furthermore, it may be possible to process a part of the first surface of the substrate assembly that is accessible through an opening in the auxiliary carrier. In some examples, processing the substrate assembly comprises at least one of: (i) grinding the substrate assembly, e.g. at the second surface; (ii) etching the substrate assembly, e.g. at the second surface; (iii) applying a processing mask over the second surface, e.g. via a lithographic method; (iv) cleaving and/or cutting the substrate assembly (i.e., splitting and/or cutting, respectively, a first part of the substrate assembly off from the rest of the substrate assembly, such that only a second part of the substrate assembly remains fixedly attached to the auxiliary carrier); (v) thermally annealing a layer and/or a part of the substrate assembly, e.g. at the second surface (e.g., by use of laser thermal anneal); (vi) ion implantation, in particular through the second surface; (vi) depositing a layer (e.g., a metallization layer) over the second surface; (vi) electrical testing of semiconductor device structures of the semiconductor device layer of the substrate assembly. At least some of the mentioned processes may require temperatures of above 350° C., in particular at the auxiliary carrier. Thus, having a high-temperature stable auxiliary carrier fixedly attached to the substrate assembly and protecting the substrate assembly during processing may allow for processing the substrate assembly at the second surface or at the first surface through an opening in the auxiliary carrier.

In some examples, material of the auxiliary carrier may be modified by at least one of: (i) a laser beam or (ii) etching. Typically, the modification is performed before the auxiliary carrier is fixedly attached to the substrate assembly. For example, the laser beam used for melting and, if applicable, re-melting or a different laser beam may be used for modification. Modification may comprise damaging and/or removing at least part of the material of the auxiliary carrier. For example, material of the auxiliary carrier may be removed by isotropic etching (e.g., wet chemical etching) and/or by anisotropic etching. Anisotropic etching may be achieved by, for example, altering the material properties within part of the auxiliary carrier, e.g. with a laser beam, in order to change an etch rate within the altered part and subsequently etching (e.g., wet chemical etching) the auxiliary carrier (so-called laser-induced deep etching, LIDE).

In an additional or alternative example, the material of the support cover may be modified, wherein the before-described steps for modifying the auxiliary carrier are applied, mutatis mutandis, to the support cover.

Some examples of methods described herein may be part of a method for manufacturing a semiconductor device. The semiconductor device may comprise at least part of the semiconductor device layer and/or at least one semiconductor device structure of the semiconductor device layer. Thus, the final result of the method may be a semiconductor device. Before and/or after performing examples of methods described herein, further processing steps may be performed in order to obtain a semiconductor device.

According to some examples, processing the substrate assembly comprises subjecting the substrate assembly, with the fixedly attached auxiliary carrier, to temperatures of above 350° C., typically above 400° C. or even above 500° C. That is to say, the auxiliary carrier is high-temperature-stable.

Furthermore, a wafer composite structure is provided. The wafer composite structure may be manufactured with at least some of the method steps described above and/or below. The wafer composite structure may be an intermediary product of examples of methods described herein. That is to say, all features described with respect to examples of the method may also be disclosed for the wafer composite structure and vice versa. The wafer composite structure may comprise an auxiliary carrier with a connection surface and a substrate assembly with a semiconductor device layer and a first surface. The auxiliary carrier and the substrate assembly are locally fused only in fused portions of the auxiliary carrier and the substrate assembly. The fused portions may cover at most 20% (or at most 15% or at most 10% even at most 5%) of the first surface of the substrate assembly.

Referring to the cross-sectional views of FIGS. 1A through 1E, exemplary embodiments of a method for processing a substrate assembly and of a wafer composite structure are explained in detail. The cross section is taken through a plane that is spanned by either one the lateral directions x,y and a vertical direction z.

In FIG. 1A, a substrate assembly 10 and an auxiliary carrier 20 are provided and the auxiliary carrier 20 is arranged at the substrate assembly such that at least part of the first surface 10a of the substrate assembly 10 and of the connection surface 20a of the auxiliary carrier 20 directly adjoin each other. A second surface 10b of the substrate assembly 10 faces away from the auxiliary carrier 20 and is opposite the first surface 10a. A back surface 20b of the auxiliary carrier 20 face away from the substrate assembly 10 and is opposite the connection surface 20a. In the vertical direction z, the substrate assembly 10 has a thickness 10t of the substrate assembly 10 and the auxiliary carrier has a thickness 20t of the auxiliary carrier 20. As a mere example, the auxiliary carrier 20 in FIGS. 1A through 1E is thinner than the substrate assembly 10. However, in other exemplary embodiments, the auxiliary carrier 20 could also be thicker or as thick as the substrate assembly 10.

Figure 1B:
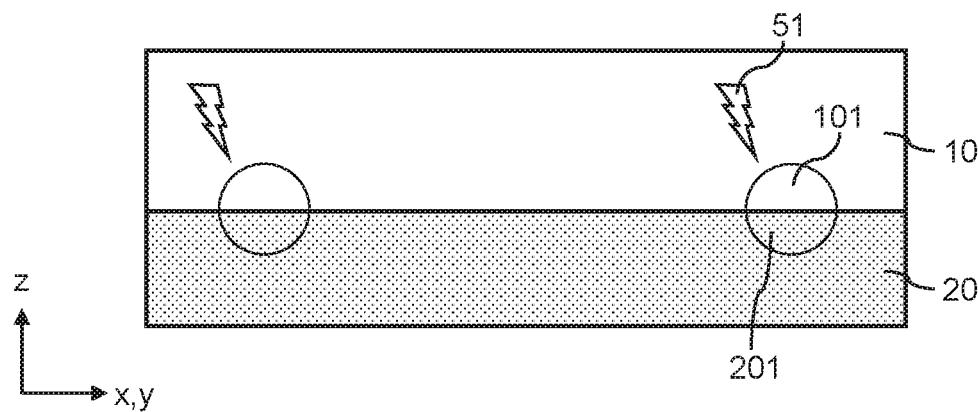

In FIG. 1B, the auxiliary carrier 20 is fixedly attached to the substrate assembly 10. This is done by melting 51 a carrier portion 201 of the auxiliary carrier 20 and a substrate portion 101 of the substrate assembly 10. The carrier portion 201 and the substrate portion 101 may directly adjoin the first surface 10a and the connection surface 20a, respectively. The carrier portion 201 and a substrate portion 101 may directly adjoin each other. The melting 51 may be performed such that the auxiliary carrier 20 and substrate assembly 10 locally fuse only in fused portions 30 (see FIG. 1C) of the auxiliary carrier 20 and the substrate assembly 10. In particular, at least part of the carrier portion 201 and of the substrate portion 101 that directly adjoin each other and that have been melted may fuse to a respective one of the fused portions 30. Melting 51 may be performed through the auxiliary carrier 20 or through the substrate assembly 10 or even through both. In a typical embodiment, melting 51 includes irradiating the auxiliary carrier 20 or the substrate assembly 10 with laser radiation.

Figure 1C:
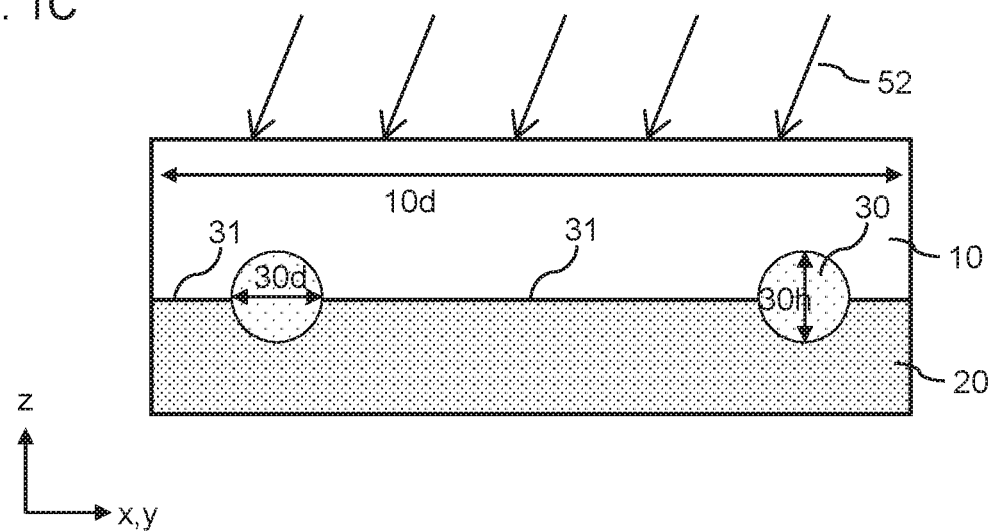

In FIG. 1C, the auxiliary carrier 20 and the substrate assembly 10 are connected via the fused portions 30, thus forming a wafer composite structure 102. As indicated in FIG. 1C by an intermediary shading of the fused portions 30, material of the auxiliary carrier 20 and of the substrate assembly 10 are merged within the fused portions 30. The fused portions 30 may be separated by unfused portions 31, where the substrate assembly 10 and the auxiliary carrier 20 are not melted. Each of the fused portions 30 may have a diameter 30d along either one of the lateral directions x,y. The diameter 30d along a lateral direction x,y may be the maximum lateral extend of the fused portion 30 along said lateral direction x,y. The diameter 30d of different fused portions 30 may differ. In addition or as an alternative, each fused portion 30 may have an asymmetric shape, such that a diameter 30d along a first lateral direction x may differ from a diameter 30d along a second lateral direction y. In either case, the diameter 30d of the fused portion is usually small compared to (e.g., at most 5% of) the diameter 10d of the substrate assembly 10. Typically, the fused portions 30 cover at most 20% or even at most 10% of the first surface 10a of the substrate assembly 10. In general, a majority of the fused portions 30 (i.e., more than 50% of the fused portions 30) or each of the fused portions 30 may have a diameter 30d along at least one lateral direction x,y or along all lateral directions x,y of at least 3 μm (e.g., at least 5 μm) and/or at most 20 μm (e.g., at most 15 μm). For at least a majority of the fused portions 30 or all of the fused portions 30, a height 30h of the fused portions 30 (i.e., a diameter of the fused portions 30 along the vertical direction z) may, for example, be at least 0.5 μm (e.g., at least 1 μm or at least 2 μm) and/or at most 10 μm (e.g., at most 6 μm or at most 4 μm). The fused portions 30 may be symmetrically distributed between the substrate assembly 10 and the auxiliary carrier 20 (i.e., the height within the substrate assembly 10 may be approximately equal to the height within the auxiliary carrier 20). Alternatively, a larger portion of at least a majority of the fused portions 30 may be positioned within one of the auxiliary carrier 20 and the substrate assembly 10, for example if the material of either the auxiliary carrier 20 and the substrate assembly 10 is easier meltable compared to the material of the other one of the auxiliary carrier 20 and the substrate assembly 10.

As indicated in FIG. 1C by arrows, the method may comprise processing 52 the substrate assembly 10, in particular a semiconductor device layer of the substrate assembly 10. Depending on whether the second surface 10b is a front side surface or a backside surface of a semiconductor device structure of the semiconductor device layer of the substrate assembly 10, the processing 52 may comprise either front side processing or backside processing, respectively. In a later process step, the auxiliary carrier 20 may be removed from the substrate assembly 10.

Figure 1D:
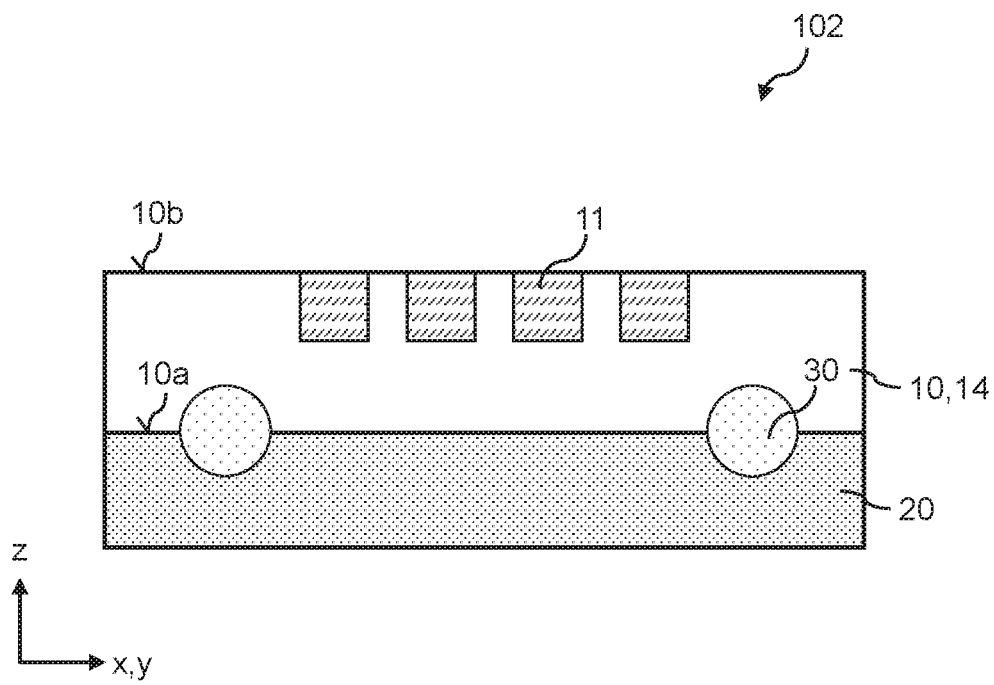
Figure 1E:
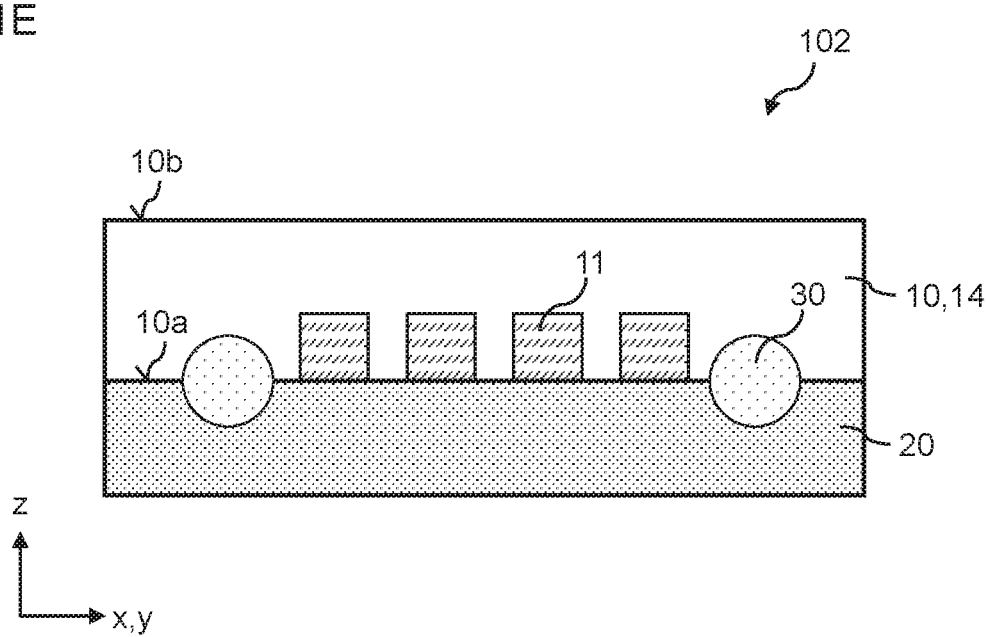

FIGS. 1D and 1E show exemplary embodiments of wafer composite structure 102. In both embodiments, the wafer composite structure 102 comprises a substrate assembly 10 with a semiconductor device layer 14 that comprises semiconductor device structures 11. As a mere example, the substrate assembly 10 comprises only the semiconductor device layer 14. However, in other examples, the substrate assembly 10 may comprise further layers, further elements and/or further components. The exemplary embodiments shown in FIGS. 1D and 1E differ in that in FIG. 1D the semiconductor device structures 11 are positioned near the second surface 10b, while in FIG. 1E the semiconductor device structures 11 are positioned near the first surface 10a. That is to say, in the exemplary embodiment shown in FIG. 1D, the second surface 10b corresponds to the front side surface of the semiconductor device layer 14, while in the exemplary embodiment shown in FIG. 1E, the first surface 10a corresponds to the front side surface of the semiconductor device layer 14. Therefore, while the auxiliary carrier 20 is attached to the substrate assembly 10, front side processing may be possible in the exemplary embodiment shown in FIG. 1D and back side processing may be available for the exemplary embodiment shown in FIG. 1E.

Figure 2A:
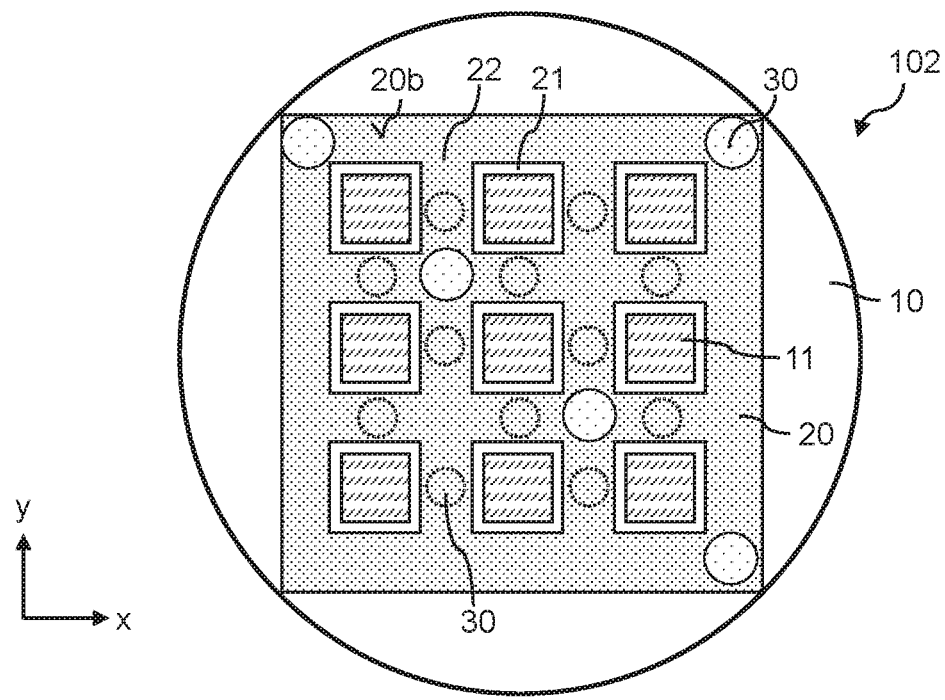
FIGS. 2A through 2D illustrate exemplary embodiments of a method for processing a substrate assembly and of a wafer composite structure, wherein different types of auxiliary carriers are illustrated.
Figure 2B:
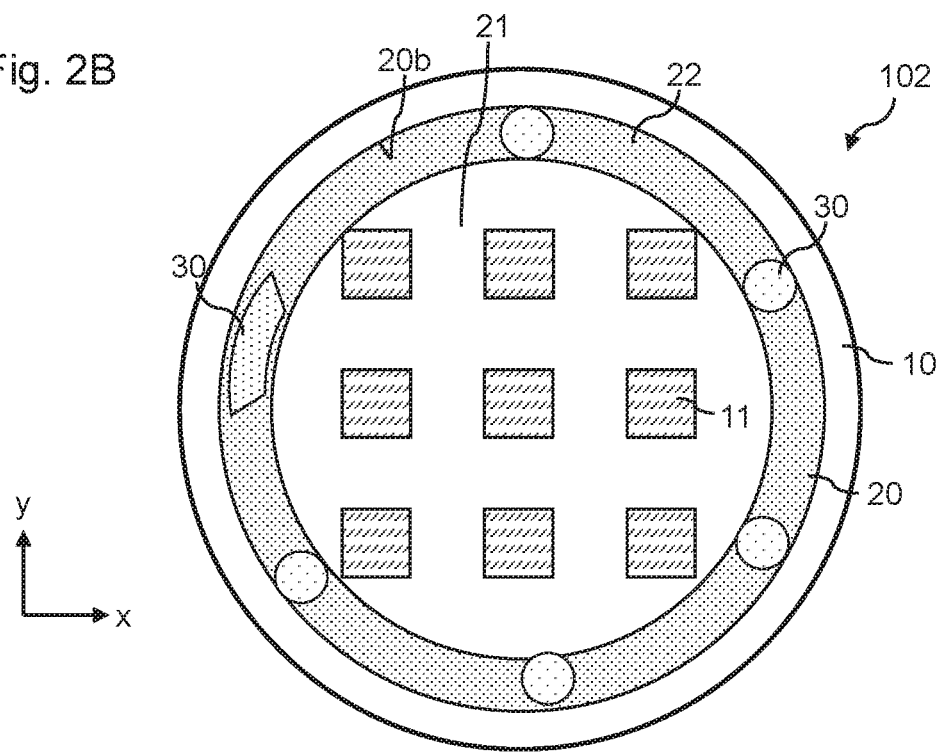
Figure 2C:
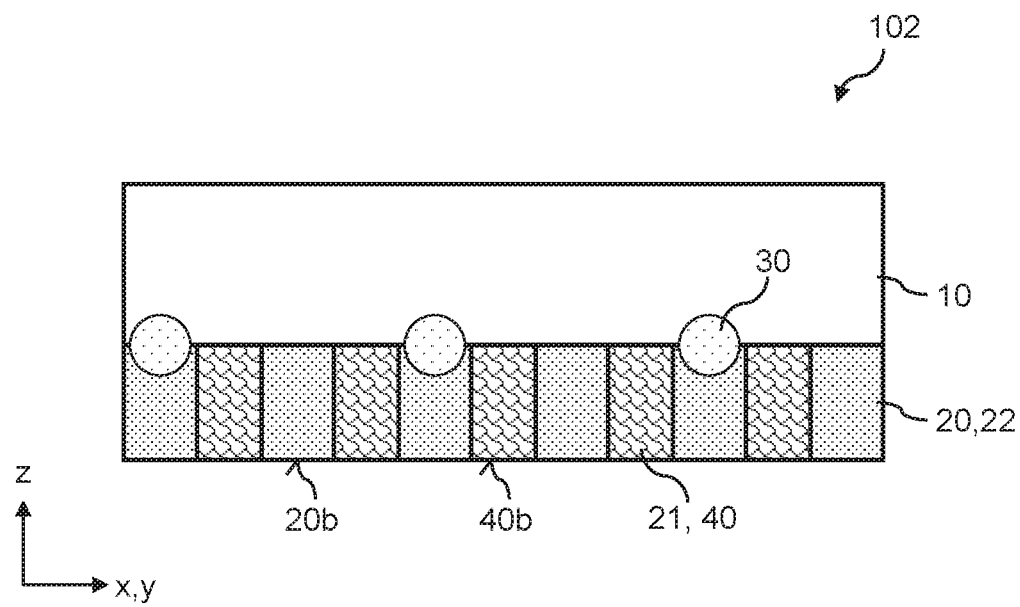
Figure 2D:
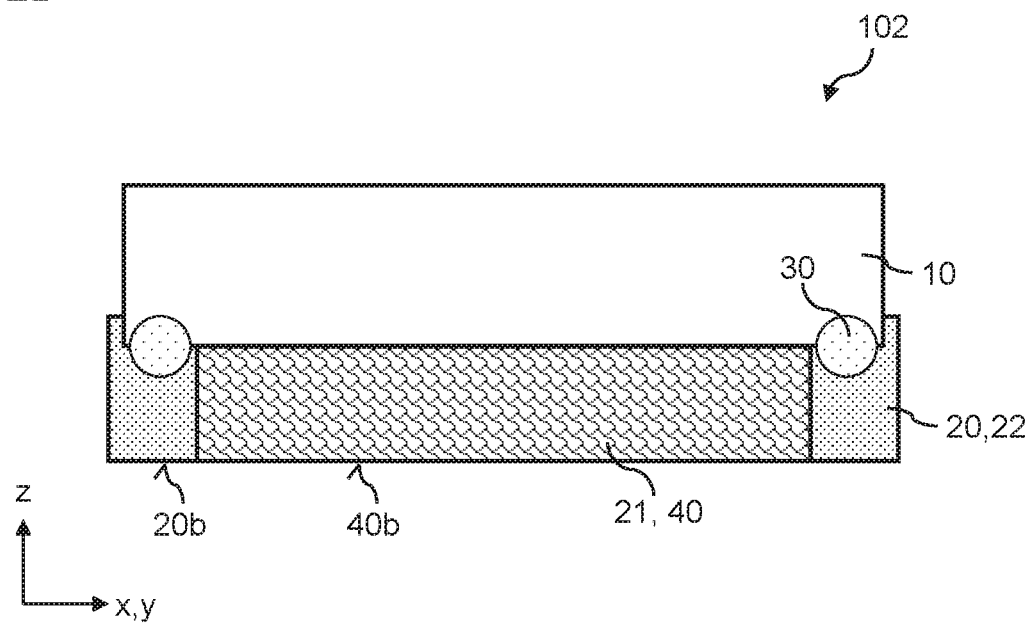

The top views of FIGS. 2A and 2B onto the back surface 20b of the auxiliary carrier 20 and the cross-sectional views of FIGS. 2C and 2D show exemplary embodiments of wafer composite structures 102 obtained from exemplary embodiments of methods described herein. In the top views of FIGS. 2A and 2B, all relevant components are shown, even though they might not be visible for an observer due to nontransparent components.

The wafer composite structures 102 of the exemplary embodiments shown in FIGS. 2A through 2D have in common that each of the wafer composite structure comprises an auxiliary carrier 20 and a substrate assembly 10 with semiconductor device structures 11. The auxiliary carrier 20 is fixedly attached to the substrate assembly 10 via fused portions 30. As a mere example, the substrate assembly 10 is illustrated with a circular shape. However, the substrate assembly 10 could also have a polygonal shape or an elliptical shape. Furthermore, the substrate assembly 10 can comprise so-called wafer flat or wafer notch at an edge of the substrate assembly 10 (not shown in the figures). The auxiliary carrier 20 comprises a solid part 22 and at least one opening 21 (e.g., a hole) enclosed by the solid part 22. The opening 21 may extend through the entire solid part 22 of the auxiliary carrier 20. The person skilled in the art will, however, appreciate that several aspects of the method are independent from the shape of the auxiliary carrier 20 and/or the shape of the substrate assembly 10.

In the exemplary embodiments shown in FIGS. 2A and 2C, the auxiliary carrier 20 has a grid-like shape, where the solid part 22 of the auxiliary carrier 20 embodies the bridges of the grid. In the exemplary embodiments shown in FIGS. 2B and 2D, the auxiliary carrier 20 has a ring-like shape, where the solid part 22 (also called ring part) of the auxiliary carrier 20 embodies the ring. In either case, the fused portions 30 may be only present at the solid part 22 of the auxiliary carrier 20. In general, the fused portions 30 may be evenly and/or homogeneously distributed along the auxiliary carrier 20.

In the grid-like case (FIGS. 2A and 2C), the fused portions 30 may be positioned at the bridges of the grid that surround the openings 20 of the grid. In some embodiments (indicated by circles with solid line and patterned fill in FIG. 2A), the fused portions 30 may be positioned at corners (e.g., only at corners), where two bridges intersect, either at only some of the corners and/or the solid parts 22 as shown in e.g. FIG. 2A and FIG. 2C or at all corners (not shown in the figures).

In additional or alternative embodiments (indicated by dashed circles without filling in FIG. 2A), the fused portions 30 may be positioned at the bridges between the corners. In some examples, for each semiconductor device structure 11, at least one fused portion 30 may be positioned between the semiconductor device structure 11 and each of its nearest-neighbor semiconductor device structures 11. In this case, a plurality of fused portions 30 may surround each semiconductor device structure 11, wherein each of the nearest-neighboring semiconductor device structures 11 of said semiconductor device structure 11 may be uniquely assignable to at least one of the fused portions 30. Separating the auxiliary carrier 20 from the substrate assembly 10 may comprise dicing through the fused portions 30 and the auxiliary carrier 20. In the case of a grid-like auxiliary carrier 20, dicing is typically performed through and along the bridges. In order to protect the semiconductor device structures of the semiconductor device layer 14 from uncontrolled separation, the fused portions 30 may be distributed such that, along each dicing line, at least one fused portion 30 is present between two semiconductor device structures 11 that would be separated via dicing along said dicing line.

In the ring-like case (FIGS. 2B and 2D), the fused portions 30 may be positioned only at the outer ring. As indicated in FIG. 2B, but also valid in general, the fused portions 30 may take different shapes and/or sizes, depending on the shapes and/or sizes of the carrier portion and the substrate portion that have been melted. However, typically, the fused portions 30 have an elliptical shape.

Independent of the shape of the auxiliary carrier 20, the auxiliary carrier 20 can have a smaller diameter than (exemplary shown in FIGS. 2A and 2B) or a larger diameter than (e.g., FIG. 2D) or the same diameter as (e.g., FIG. 2C) the substrate assembly 10 along the lateral directions x,y. In the case where the auxiliary carrier 20 has a larger diameter than the substrate assembly 10 along the lateral directions x,y, the auxiliary carrier 20 may protect an edge of the substrate assembly 10.

As shown in the exemplary embodiments of FIGS. 2C and 2D, the openings 21 between the solid parts 22 of the auxiliary carrier 20 may be filled with a filler material 40 (e.g., a foam). An outer surface 40b of the filler material 40 may terminate flush with the back surface 20b of the auxiliary carrier 20. In other embodiments, the filler material 40 may have a smaller extension along the vertical direction z than the auxiliary carrier 20. The filler material 40 may cover unfused portions 31, in particular semiconductor device structures 30, of the substrate assembly 10.

With reference to the cross-sectional views of FIGS. 3A through 3D, methods for detaching the auxiliary carrier 20 from the substrate assembly 10 are explained in detail. In the exemplary embodiment shown in FIG. 3A, the fused portions 30 are re-melted 51'. Typically, only the fused portions 30 are re-melted 51'. By re-melting 51' the fused portions 30, the fused portions 30 may be softened and/or released. Moving apart 54 the auxiliary carrier 20 and the substrate assembly 10 while the fused portions 30 are re-melted and/or before the re-melted fused portions solidify results in detaching the auxiliary carrier 20 from the substrate assembly 10 (right hand side of FIG. 3A).

Figure 3A:
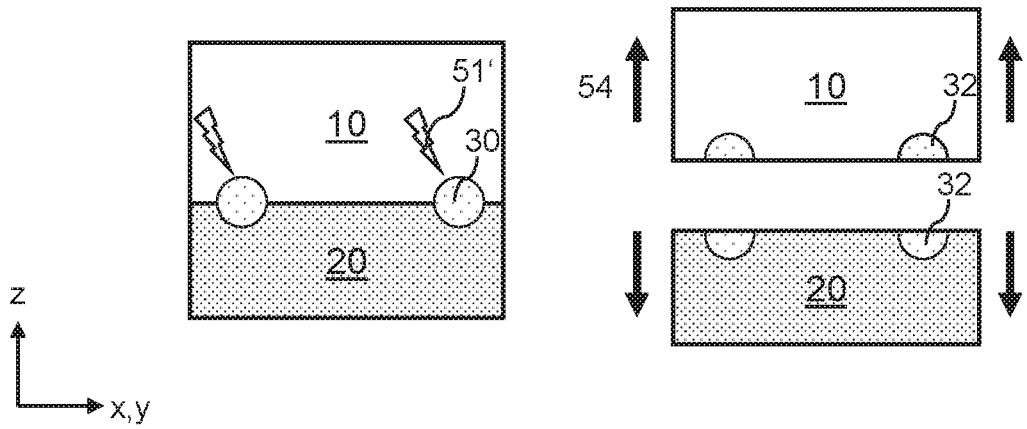
FIGS. 3A through 3D illustrate exemplary embodiments of a method for processing a substrate assembly and of a wafer composite structure, wherein the auxiliary carrier is detached from the substrate assembly.
Figure 3B:
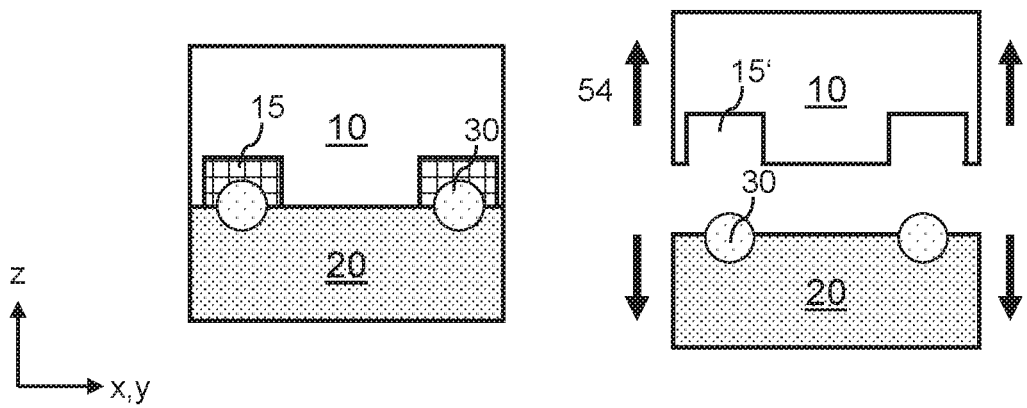

In the exemplary embodiment shown in FIG. 3B, the substrate assembly 10 comprises a mechanically weak structure 15 (e.g., a porous region), wherein the fused portions 30 only cover the mechanically weak structure 15. Detaching the auxiliary carrier 20 from the substrate assembly 10 may comprise removing the mechanically weak structure 15, e.g. via etching. This may result in holes 15' in the substrate assembly 10 in the regions where the mechanically weak structure 15 was present. The fused portions 30 are still connected to the auxiliary carrier 20 and can be removed from the substrate assembly 10 together with the auxiliary carrier 20 (shown on the right hand side of FIG. 3B). In contrast to the embodiment shown in FIG. 3B, the mechanically weak structure 15 may also be comprised by the auxiliary carrier 20. In this case, the auxiliary carrier 20 would comprise holes 15' after removal of the mechanically weak structure 15 and the fused portions 30 would be connected to the substrate assembly 10 after detaching the auxiliary carrier 20.

Figure 3C:
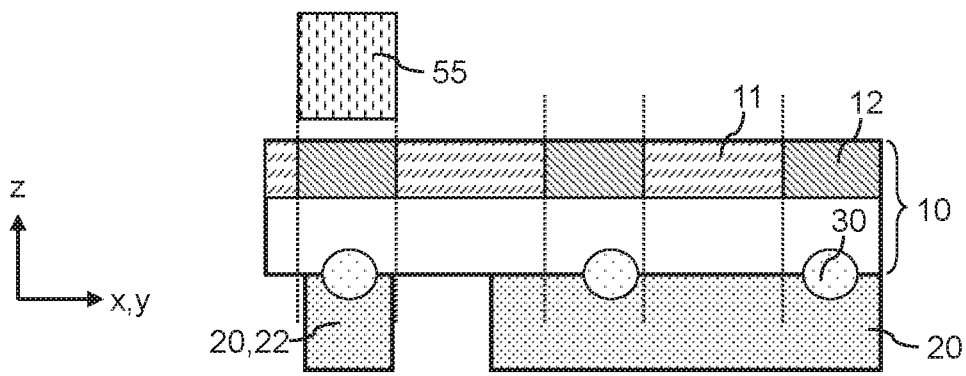

In the exemplary embodiment shown in FIG. 3C, the substrate assembly 10 comprises semiconductor device structures 11 that are separated by separation regions 12 (e.g., so-called KERF regions). The fused portions 30 are only present in regions directly below the separation regions 12. The auxiliary carrier 20 may also only be present in regions directly below the separation regions 12 (left hand side of FIG. 3C, e.g. in the case of a grid-like shaped auxiliary carrier 20 with bridges 22 only located below the separation regions 12) or may also be covered by the semiconductor device structures 11 (right hand side of FIG. 3D). In either case, dicing 55 through the separation regions 12 along the vertical direction z with a dicing tool results in destroying the fused portions 30 and thus the connection between the auxiliary carrier 20 and the substrate assembly 10. In addition, the individual semiconductor device structures 11 are separated from one another via the dicing process 55.

Figure 3D:
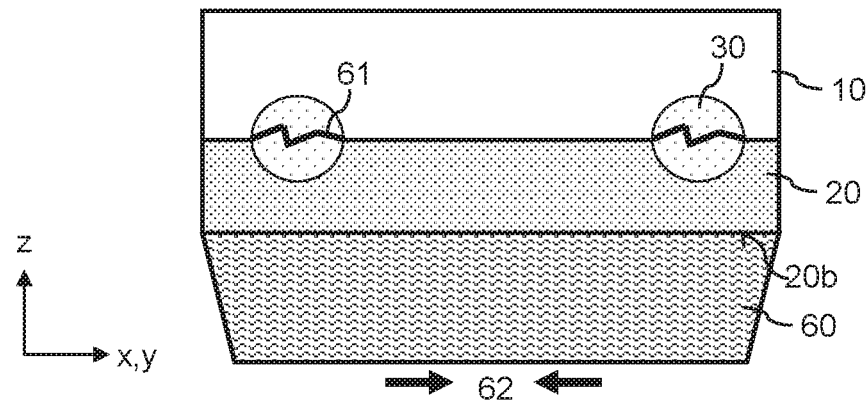

In the exemplary embodiment shown in FIG. 3D, a stress-inducing layer 60 (e.g., a polymer layer) is attached to the back surface 20b of the auxiliary carrier 20. It may be possible that the stress-inducing layer 60 is attached to the auxiliary carrier 20 prior to fixedly attaching the auxiliary carrier 20 to the substrate assembly 10 or after fixedly attaching the auxiliary carrier 20 to the substrate assembly 10. In the latter case, the stress-inducing layer 60 may be attached to the auxiliary carrier 20 before or after processing the substrate assembly 10. For example, the stress-inducing layer 60 may be attached to the back surface 20b via an adhesion layer (not shown in FIG. 3D). Even though in the exemplary embodiment of FIG. 3D the stress-inducing layer 60 is attached to the auxiliary carrier 20 it may also be possible that the stress-inducing layer is attached to the substrate assembly 10. It may even be possible that a respective stress-inducing layer 60 is attached to both the auxiliary carrier 20 and the substrate assembly 10. In either case, the following processing steps may be used for removing the auxiliary carrier 20 from the substrate assembly 10.

The stress-inducing layer 60 and/or the wafer composite structure 102 comprising the auxiliary carrier 20 and the substrate assembly 10 may be cooled. Due to a CTE mismatch between the stress-inducing layer 60 and the wafer composite structure 102, an expansion or contraction of the stress-inducing layer 60 during cooling is different to an expansion or contraction of the wafer composite structure 102 during cooling. This results in a difference in thermal expansion and thus to stresses 62 within the stress-inducing layer 60 that are transferred to the wafer composite structure 102. The stresses may be released by building of cracks 61 within the fused portions 30. Along these cracks, the fused portions may be destroyed, thus resulting in release of the connection between the auxiliary carrier 20 and the substrate assembly 10. Afterwards, the stress-inducing layer 60 may be removed from the auxiliary carrier 20. However, it may also be possible that the stress-inducing layer 60 remains at the auxiliary carrier 20, either for use in connection with a further substrate assembly 10 or for disposal.

Figure 4:
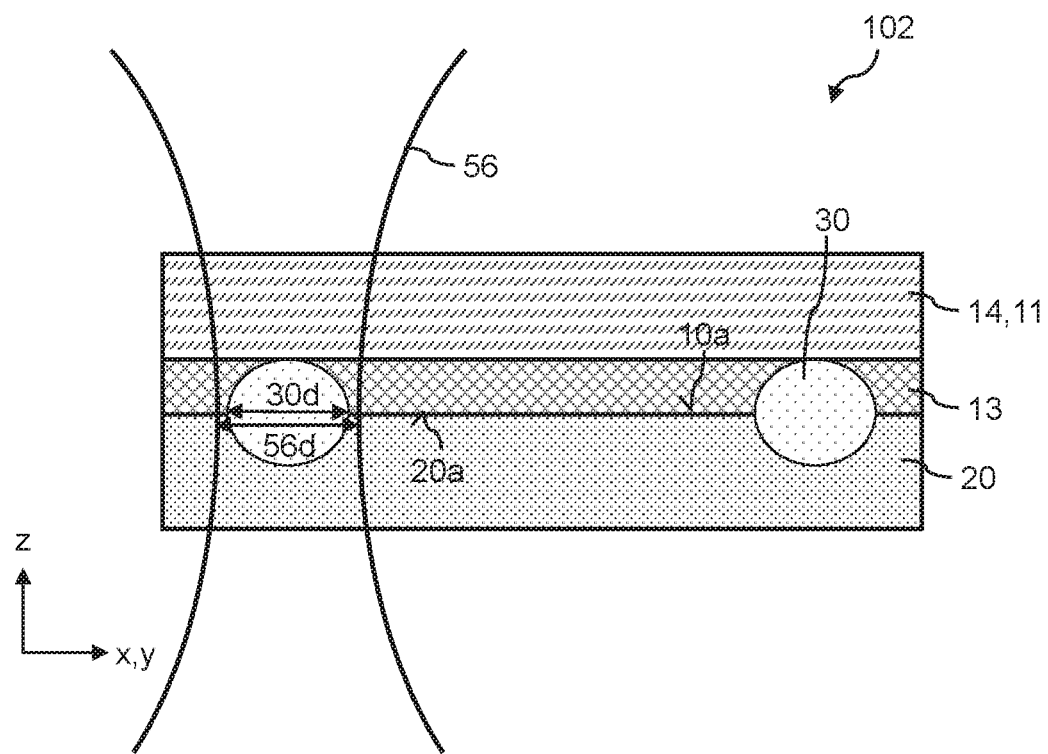
FIGS. 4, 5A and 5B illustrate exemplary embodiments of a method for processing a substrate assembly and of a wafer composite structure.

With reference to the cross-sectional view of FIG. 4, an exemplary embodiment of a method and a wafer composite structure 102 described herein are explained in detail. For melting a substrate part of the substrate assembly 10 and a carrier part of the auxiliary carrier 20 to create the wafer composite structure 102, a laser beam may be used (e.g., for laser welding and/or for laser micro-welding). FIG. 4 shows an exemplary cross-section along a propagation direction of a beam width (e.g., a FWHM) of a laser beam 56 used for laser (micro-)welding. As a mere example, a Gaussian beam with a focus point at the fused portions 30, i.e. in the region where melting and/or, if applicable, re-melting, takes places, is assumed. In the focus point, the beam width may have a minimum beam width 56d. The diameter 30d of the fused portions 30 may be smaller than the minimum beam width 56d. This may be due to the fact that the power of the laser beam at the outer part of the beam may not be sufficiently high to allow for melting and/or, if applicable, re-melting. The radiation of the laser beam may be absorbed at the carrier part and the substrate part, thus resulting in melting and/or, if applicable, re-melting of the material of the carrier part and the substrate part (e.g., via a thermal process or via cold ablation). If the material of the semiconductor device layer 14 is nontransparent for the used laser beam 56 (i.e., absorbs a sufficiently high portion of the laser beam 56 to allow for melting/re-melting), material of the semiconductor device layer 14 may be directly fused (or unfused) with material of the auxiliary carrier 20, The material of the semiconductor device layer 14 may, however, be transparent for the used laser beam (i.e., may not absorb a sufficiently high portion of the laser beam to allow for melting). In this case, the substrate assembly 11 may comprise an absorption layer 13. The absorption layer 13 may be in direct contact with the first surface 10a of the substrate assembly 10. The absorption layer 13 may be a continuous layer, as shown in FIG. 4, or may be structured. For example, the absorption layer 13 may be part of a metallization structure of the semiconductor device layer 14 with the semiconductor device structures 11. The laser beam 56 may be at least partially absorbed in the absorption layer 13 and part of the absorption layer 13 may be melted, thus resulting in fused portions 30 between a carrier part of the auxiliary carrier 20 and a part of the absorption layer 13 that is a substrate part of the substrate assembly 10.

Figure 5A:
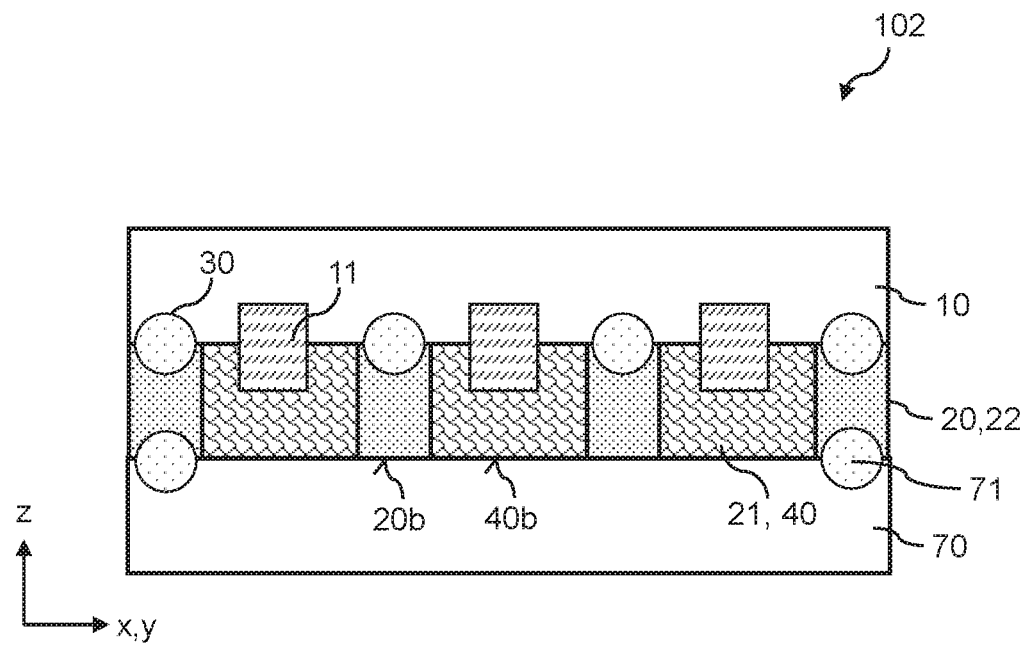
Figure 5B:
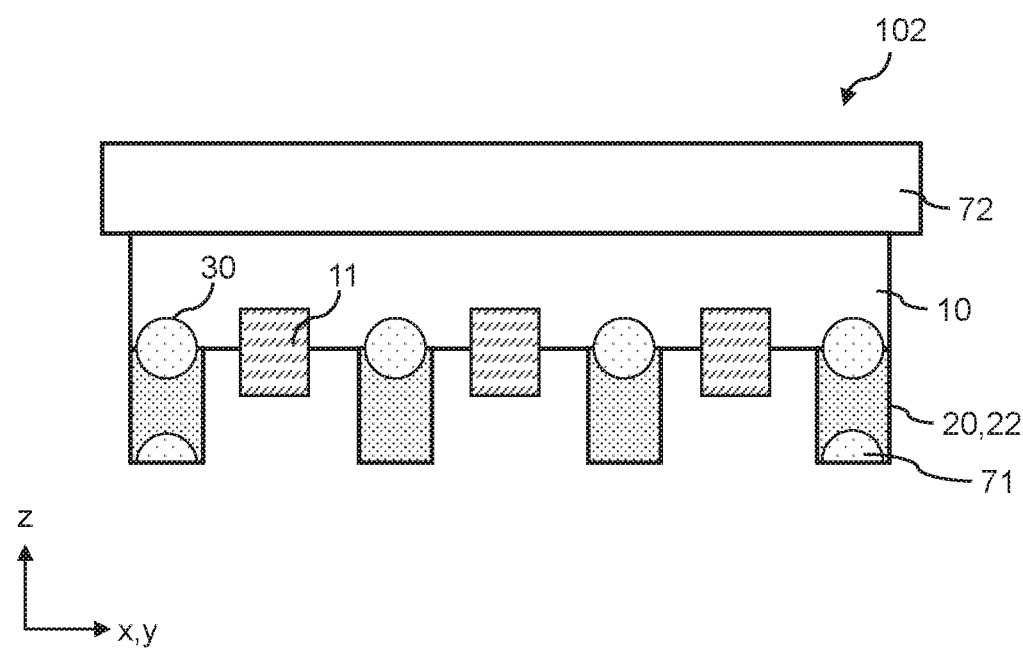

In connection with the cross-sectional views of FIGS. 5A and 5B, further exemplary embodiments of a method and a wafer composite structure described herein are explained in detail. As a mere example, the second surface 10b of the substrate assembly 10 is shown as a back side surface (and thus the first surface 10a being a front side surface). However, the method may also be applied, mutatis mutandis, in the case of the second surface 10b being a front side surface. The first surface 10a may be fully process before the auxiliary carrier 20 is fixedly attached to the substrate assembly 10.

The auxiliary carrier 20 comprises openings 21. The openings 21 may be aligned with the semiconductor device structures 11 of the substrate assembly 10. As a mere example, at least part of the semiconductor device structures 11 partially protrude from the rest of the substrate assembly 10. After fixedly attaching the auxiliary carrier 20 to the substrate assembly 10, the openings 21 in the auxiliary carrier 20 may be filled with an optional filler material 40. The filler material 40 may stabilize the protruding part of semiconductor device structures 11 and/or may protect the semiconductor device structures 11. The semiconductor device structures 11 may be embedded in the filler material 40. A support cover 70 may be fixedly attached to the second surface 10b of the auxiliary carrier 20, e.g. via further fused portions 71 that may have arisen from locally melting a portion of the auxiliary carrier 20 with a portion of the support cover 70. The further fused portions 71 may have similar properties as the fused portions 30, except that different materials may be fused in the further fused portions 71 compared to the fused portions 30. The support cover 70 may, however, also be dispensed with in some embodiments.

The second surface 10b may be processed with the auxiliary carrier 20 fixedly attached to the substrate assembly 10. For example, processing may comprise at least one of: grinding; etching; cleaving (e.g., with a laser-assisted splitting method and/or with an ion-implantation-assisted splitting method); cutting (e.g., with electrical discharge machining, EDM, and/or electro-chemical discharge machining, ECDM); thermal annealing at temperatures of above 350° C. and below 600° C.; lithography steps; ion implantation; layer deposition. Furthermore, the first surface 10a may be at least partially processed through at least one opening 21 in the auxiliary carrier 20, in particular with at least one of the mentioned process steps. In the case of processing the first surface 10a through an opening 21, the filler material 40 may be dispensed with or may be removed before processing the first surface 10a.

In an optional subsequent step, the optional support cover 70 and/or the optional filler material 40 may be removed. In some examples, removing the support cover 70 may comprise re-melting the further fused portions 71. Removing the filler material 40 may, for example, comprise at least one of: dissolving the filler material 40, etching (e.g., wet etching) the filler material 40, plasma-treating the filler material 40, mechanically removing the filler material 40. Part of the further fused portions 71 may remain at the auxiliary carrier 20. The wafer composite structure 102 comprising the processed substrate assembly 10 and the auxiliary carrier 20 (and optionally the support cover and/or the filler material 40) may be cleaned (e.g., via a water flush) and dried. Afterwards, further processing steps (e.g., a thermal anneal and/or deposition of a metallization layer, optionally by use of electrochemical deposition) may be applied to the substrate assembly 10, in particular to the second surface 10b of the substrate assembly 10. The entire wafer composite structure 102 may then be arranged on a dicing frame and the auxiliary carrier 20 may be detached, either by or before dicing the semiconductor device layer 14 of the substrate assembly 10. Alternatively, a temporary carrier 72 (e.g., a carrier foil) may be attached to the second surface 10b, as shown in FIG. 5B. The temporary carrier 72 may be attached to the second surface 10b before or after oval of the support cover 70. The auxiliary carrier 20 may be detached from the substrate assembly 10 while the temporary carrier 72 is attached to the second surface 10b (not shown in FIG. 5B). The substrate assembly 10 may be arranged on a dicing frame with the temporary carrier attached to the substrate assembly 10 and the temporary carrier 72 may be removed, typically before dicing (not shown in the figures). In some embodiments, the temporary carrier 72 may be part of or may comprise a dicing frame. Before and/or after detaching the auxiliary carrier 20 from the substrate assembly 10, electrical testing of the semiconductor device structures 11 of the semiconductor device layer 14 may be performed.

Terms such as "first", "second", and the like, are used to describe various elements, regions, sections, etc. and are also not intended to be limiting. Like terms refer to like elements throughout the description.

Directional terms, such as "above", "beyond", "over", "under", "below", etc., merely define the orientation of two components with respect to one another and are not to be construed as defining an absolute orientation with respect to an outside environment (e.g., the earth's gravitational field). For example, a first component that is "over" or "above" a second component is equivalent to the first component being "under" or "below" the second component after a rotation about 180°.

Further, if the first component is "covered" by a second component, this does not mean that the first and second components directly adjoin each other. Rather, a further component may be located between the first and second component.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific examples have been illustrated and described herein, it will be appreciated by those of ordinary skill in the art that a variety of alternate and/or equivalent implementations may be substituted for the specific examples shown and described without departing from the scope of the present invention. In particular, it is to be understood that the features of the various examples described herein may be combined with each other, unless specifically noted otherwise. Therefore, it is intended that this invention be limited only by the claims and the equivalents thereof.

What is claimed is:

1. A method for processing a substrate assembly with a semiconductor device layer, the method comprising:
    arranging an auxiliary carrier at the substrate assembly such that a connection surface of the auxiliary carrier and a first surface of the substrate assembly directly adjoin each other;
    fixedly attaching the auxiliary carrier to the substrate assembly by melting a carrier portion of the auxiliary carrier and a substrate portion of the substrate assembly that directly adjoins the carrier portion such that the auxiliary carrier and the substrate assembly locally fuse only in fused portions of the auxiliary carrier and the substrate assembly, wherein the fused portions are laterally separated from each other by at least one unfused portion; and processing the semiconductor device layer of the substrate assembly with the auxiliary carrier fixedly attached to the substrate assembly.

2. The method of claim 1, further comprising:
detaching the auxiliary carrier from the substrate assembly by re-melting the fused portions of the auxiliary carrier and the substrate assembly such that the fused portions are released.

3. The method of claim 1, further comprising:
detaching the auxiliary carrier from the substrate assembly by changing the temperature of the auxiliary carrier from a first carrier temperature to a second carrier temperature while changing the temperature of the substrate assembly from a first substrate temperature to a second substrate temperature,
wherein the second substrate temperature is different from the second carrier temperature,
wherein the change in temperature is performed, and the material of the substrate assembly and the material of the auxiliary carrier are chosen, such that the auxiliary carrier and the substrate assembly experience a different thermal expansion during the change in temperature.

4. The method of claim 1, further comprising:
attaching a stress-inducing layer to the auxiliary carrier and/or to the substrate assembly at a first temperature;
cooling at least the stress-inducing layer to a second temperature below the first temperature while the stress-induced layer is attached to the auxiliary carrier or to the substrate assembly; and
removing the auxiliary carrier from the substrate assembly;
wherein a coefficient of thermal expansion (CTE) of the stress-inducing layer differs from a CTE of the auxiliary carrier and the substrate assembly,
wherein the second temperature and the difference in CTE of the stress-inducing layer and the CTE of the auxiliary carrier and the substrate assembly are chosen such that cracks are induced in at least some of the fused portions.

5. The method of claim 1, wherein the semiconductor device layer of the substrate assembly comprises a plurality of semiconductor device structures and a plurality of separation regions, wherein neighboring semiconductor device structures are laterally separated from one another by at least one of the separation regions, wherein the fused portions are located only above the separation regions in a vertical direction, the method further comprising:
separating the semiconductor device structures and detaching the auxiliary carrier from the substrate assembly by dicing, along the vertical direction, through the separation regions and through respective fused portions above the separation regions.

6. The method of claim 1, wherein the substrate assembly comprises a mechanically weak structure, wherein in a vertical direction, the fused portions and the mechanically weak structure overlap, and wherein detaching the auxiliary carrier comprises selectively removing the mechanically weak structure from the substrate assembly.

7. The method of claim 1, further comprising:
after attaching the auxiliary carrier to the substrate assembly and before detaching the auxiliary carrier from the substrate assembly, attaching a temporary carrier to a second surface of the substrate assembly opposite the first surface.

8. The method of claim 1, wherein at the first surface, the fused portions are laterally separated from another by at least one unfused portion where the auxiliary carrier and the substrate assembly are not fused, wherein the auxiliary carrier comprises at least one opening, and wherein the auxiliary carrier is fixedly attached to the substrate assembly such that, in a vertical direction, the at least one opening and at least one unfused portion at least partially overlap.

9. The method of claim 1, wherein the auxiliary carrier comprises a ring part and at least one opening, wherein the ring part encloses the at least one opening, wherein the ring part covers only an outer circumference of the substrate assembly, and wherein the fused portions are located only in a region of the ring part.

10. The method of claim 1, wherein the auxiliary carrier comprises a plurality of bridges of a grid and a plurality of openings, wherein the bridges enclose the plurality of openings, and wherein the fused portions are located only in a region of the bridges of the grid.

11. The method of claim 1, wherein at the first surface, the fused portions are laterally separated from another by at least one unfused portion where the auxiliary carrier and the substrate assembly are not fused, and the method further comprising:
applying a filler material such that the filler material at least partially covers the at least one unfused portion.

12. The method of claim 1, wherein the auxiliary carrier mechanically stabilizes and/or protects the substrate assembly during processing of the substrate assembly.

13. The method of claim 1, further comprising:
after fixedly attaching the auxiliary carrier to the substrate assembly, fixedly attaching a support cover to the auxiliary carrier at a back surface of the auxiliary carrier,
wherein the back surface is opposite the connection surface.

14. The method of claim 13, wherein the auxiliary carrier comprises at least one opening, wherein the support cover at least partially overlaps with the at least one opening of the auxiliary carrier.

15. The method of claim 1, wherein melting and/or re-melting the carrier portion and the substrate portion comprises welding and/or laser welding.

16. The method of claim 1, wherein the substrate portion that is melted comprises an absorption layer, and wherein the absorption layer has a higher absorption coefficient than a semiconductor material of the semiconductor device layer.

17. The method of claim 1, wherein processing the substrate assembly comprises at least one of:
grinding the substrate assembly;
etching the substrate assembly;
applying a processing mask;
cleaving and/or cutting the substrate assembly;
thermally annealing a layer and/or a part of the substrate assembly;
ion implantation;
depositing a metallization layer; and
electrical testing of semiconductor device structures of the substrate assembly.

18. The method of claim 1, further comprising:
modifying a material of the auxiliary carrier by a laser beam and/or etching before the auxiliary carrier is fixedly attached to the substrate assembly.

19. The method of claim 1, wherein the method is part of a method for manufacturing a semiconductor device.

20. The method of claim 1, wherein processing the substrate assembly comprises subjecting the substrate assembly with the fixedly attached auxiliary carrier to temperatures of above 350° C.

21. The method of claim 1, wherein at least a majority of the fused portions has a diameter along two orthogonal lateral directions of at most 20 µm.

22. The method of claim 1, wherein the fused portions cover at most 20% of the first surface of the substrate assembly.

23. A method for processing a substrate assembly with a semiconductor device layer, the method comprising:
arranging an auxiliary carrier at the substrate assembly such that a connection surface of the auxiliary carrier and a first surface of the substrate assembly directly adjoin each other;
fixedly attaching the auxiliary carrier to the substrate assembly by melting a carrier portion of the auxiliary carrier to a substrate portion of the substrate assembly;
processing the semiconductor device layer of the substrate assembly with the auxiliary carrier fixedly attached to the substrate assembly; and
separating the auxiliary carrier from the substrate assembly by a re-melting process.

24. A method for processing a substrate assembly with a semiconductor device layer, the method comprising:
arranging an auxiliary carrier at the substrate assembly such that a connection surface of the auxiliary carrier and a first surface of the substrate assembly directly adjoin each other, the auxiliary carrier having an opening;
fixedly attaching the auxiliary carrier to the substrate assembly by melting a carrier portion of the auxiliary carrier to a substrate portion of the substrate assembly; and
processing the semiconductor device layer of the substrate assembly with the auxiliary carrier fixedly attached to the substrate assembly.

25. The method of claim 24, wherein the auxiliary carrier is ring shaped.

26. A wafer composite structure, comprising:
an auxiliary carrier with a connection surface; and
a substrate assembly with a semiconductor device layer and a first surface,
wherein the auxiliary carrier and the substrate assembly are locally fused only in fused portions of the auxiliary carrier and the substrate assembly,
wherein the fused portions are laterally separated from each other by at least one unfused portion.

\* \* \* \* \*